United States Patent [19]

Flynn et al.

[11] Patent Number: 5,229,252
[45] Date of Patent: Jul. 20, 1993

[54] PHOTOIMAGEABLE COMPOSITIONS

[75] Inventors: Kathy M. Flynn, Tustin; Vinai M. Tara, Anaheim; Kathleen L. Nelson, Pasadena, all of Calif.

[73] Assignee: Morton International, Inc., Chicago, Ill.

[21] Appl. No.: 779,410

[22] Filed: Oct. 21, 1991

Related U.S. Application Data

[63] Continuation-in-part of Ser. No. 678,899, Mar. 28, 1991, abandoned, which is a continuation of Ser. No. 364,403, Jun. 9, 1989, abandoned.

[51] Int. Cl.$^5$ ................................................. G03C 1/73
[52] U.S. Cl. ..................................... 430/280; 430/281; 430/288; 430/916; 430/927; 522/101; 522/104; 522/170
[58] Field of Search ............... 430/280, 281, 288, 916, 430/918, 927; 522/101, 103, 170

[56] References Cited

U.S. PATENT DOCUMENTS

| | | | |
|---|---|---|---|
| 4,481,258 | 11/1984 | Sattler et al. | 522/103 |
| 4,786,579 | 11/1988 | Tazawa et al. | 430/280 |
| 4,789,620 | 12/1988 | Sasaki et al. | 430/281 |

*Primary Examiner*—Jack P. Brammer
*Attorney, Agent, or Firm*—Wayne E. Nacker; Gerald K. White

[57] ABSTRACT

A photoimageable composition for forming a solder mask has a photopolymerizable acrylate chemical system which renders exposed portions insolvable to alkaline aqueous developers and an epoxy chemical system which hardens the composition after exposure and development. The acrylate chemical system comprises acrylate monomers, epoxy-acrylate oligomers and a photoinitiator. The epoxy chemical system comprises an epoxy resin and a curative therefore. The composition further comprises a cross-linking agent which is reactive with hydroxyl groups of the acrylate and epoxy chemical systems.

7 Claims, No Drawings

PHOTOIMAGEABLE COMPOSITIONS

This application is a continuation-in-part of Ser. No. 07/678,899, filed Mar. 28, 1991, now abandoned which is a continuation of Ser. No. 07/364,403 filed Jun. 9, 1989 now abandoned.

The present invention is directed to compositions which may be applied as a layer on a substrate, photoimaged, developed and cured to form a patterned, permanent layer, suitable as a solder mask for a printed circuit board or the like.

BACKGROUND OF THE INVENTION

Solder masks are patterned films or layers which are designed to permanently overlie the printed circuitry on a printed circuit board. Patterned open areas of a solder mask selectively permit solder to adhere to metal of the printed board. The solder mask also protects the circuitry against short-circuiting.

Because solder masks are designed to provide a permanent layer, hardness and durability of the layer are considered important features of a solder mask composition. Generally, the solder mask is the outer layer of the printed circuit board; thus, appearance is also importance.

Photoimageable compositions may be applied to a printed circuit board by a variety of methods, such as screen printing, electrostatic spray coating, curtain coating or as a layer or laminate of a dry film. It is therefore desirable that a photoimageable composition coat a printed circuit board in a variety of application methods.

It is a general object of the present invention to provide an improved photoimageable composition which may be applied to a printed circuit board, photoimaged, developed with an alkaline aqueous developer and cured to form a hard, permanent solder mask. The permanent solder mask will withstand plating solutions (metal depositing baths) which operate in the range of pH 12 and above.

SUMMARY OF THE INVENTION

In accordance with the present invention there is provided a composition which may be applied as a layer to a printed circuit board by a variety of methods, exposed to patterned actinic radiation to insolubilize exposed portions of the layer, developed in alkaline aqueous solution to remove unexposed portions of the layer, and cured to harden the remaining portions of the layer into a hard, permanent mask. The photoimageable composition comprises (a) between about 10 and about 40 wt. percent acrylic monomers, (b) between about 3 and about 15 wt. percent photo initiator, (c) between about 5 and about 35 wt percent epoxy-acrylate oligomers, (d) between about 20 and about 80 wt. percent epoxy resins (e) between about 0.1 and about 10 wt. percent of an acidic curative for the epoxy resin and, optionally, but highly preferably, (f) between about 2 and about 15 wt. percent of a cross-linking agent.

DETAILED DESCRIPTION OF CERTAIN PREFERRED EMBODIMENTS

The photoimageable compositions according to the present invention each contains at least the following components: (a) acrylic monomers, (b) photoinitiator(s), (c) epoxy-acrylate oligomers, (d) epoxy resins, and (e) an acidic curative for the epoxy resins. Generally the photoimageable composition also includes (f) a cross-linking agent such as a melamine-formaldehyde resin or a blocked multifunctional isocyanate. These components (a)-(f) are selected to be mutually miscible in an organic solvent so that when they are mixed together in an organic solvent, these components form a clear homogeneous solution. Upon evaporation of the organic solvent, components (a)-(f) are mutually compatible so as to form a homogeneous dried composition. Herein, unless otherwise stated, all percentages are by weight and are calculated relative to the total weight of components (a)-(f). The amounts of any additional ingredients, such as fillers, solvents, etc. are calculated relative to the sum of the weights of (a)-(f). The homogeneous dried composition of (a)-(f) is soluble in alkaline aqueous solution, whereby the photoimageable composition as a layer on a printed circuit board is developable with alkaline aqueous solution.

The composition according to the present invention includes an acrylic chemical system by which the composition is photopolymerized and an epoxy chemical system which is curable to harden the composition after exposure and development. The two chemical systems, however, are not exclusive of each other and components of the two chemical systems are believed to interact chemically with each other. This is especially true when the composition includes a cross-linking agent (f).

The acrylic system includes the acrylic monomers (a), the epoxy-acrylate oligomer (c) and the photoinitiator (b). The epoxy system includes the epoxy resin (d) and the acidic curative (e) therefor. If a cross-linking agent (f) is used, it is selective to be reactive with free hydroxyl groups of components of both the acrylic and epoxy systems.

The monomers are selected from a variety of esters of acrylic acids, such as methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxy-phenyl)-propane diacrylate, pentaerythritol tetracrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate. The acrylic monomers (a) typically comprise between 10 and about 40 wt. percent of components (a)-(f). Lower levels may be insufficient to insolubilize the portions of the photoimageable composition layer that have been exposed to actinic radiation. Higher levels of acrylic monomers may result in a solder mask which is too soft for many applications.

By epoxy-acrylate oligomer (c) is meant, herein, an oligomer formed from an epoxy backbone which is reacted with acrylic acids so that at least about 90% of the epoxy groups are esterified with the acrylic acids. Acrylic acids, such as those used in the acrylic (ester) monomers described above are suitable for this purpose. In reaction of the acrylic groups with the epoxy groups of the epoxy oligomer, the acid molecules each forms an ester bond with the oligomer background and a hydroxyl group is formed on the vicinal carbon atom. Because substantially all of the epoxy groups are reacted with acrylic acid moieties, the epoxy-acrylate oligomer functions primarily as an acrylate, the acrylate moieties of the oligomer polymerizing along with the acrylic monomers during the photoinitiated reaction which renders exposed portions of the photoimageable composition layer insoluble to aqueous alkaline solution. The substantial hydroxyl functionality provides the basis for cross-linking with the cross-linking agent (f), if such a cross-linking agent (f) is used.

Preferred epoxy-acrylate oligomers are diacrylate (or methacrylate) esters of bisphenol A type resins. These oligomers are developed to combine good UV/EB cure response along with the chemical resistance and durability of the epoxy resins. The epoxy-acrylate oligomers are derived from bisphenol A resins having a functionality of two so they also have a functionality of two.

The synthesis of polyfunctional acrylate resins and other unsaturated esters from the corresponding epoxy derivatives is described in the following U.S. Pat. Nos. 3,256,226; 3,317,465; 3,345,401; 3,373,221; 3,377,406; 3,432,478; 3,548,030; 3,564,074; 3,634,542 and 3,637,618.

The epoxy-acrylate oligomer generally comprises between about 5 and about 25 wt. percent of the total weight of components (a)–(f), preferably between about 12 and 18 wt. percent. Epoxy-acrylate oligomers used in the photoimageable composition preferably have molecular weights of between about 500–2000.

Also required in conjunction with the polymerizable acrylate substance is a chemical initiator system which generates free radicals in the presence of actinic radiation and thereby causes the polymerization of the acrylic substances. Polymerization of acrylic monomers and acrylic moieties of the epoxy-acrylate oligomers into a three-dimensional structure insolubilizes the photoimageable composition. The choice of the photosensitive, free radical-generating initiator system is not considered to be critical to the practice of the present invention, and a wide variety of such compounds may be successfully utilized in the practice of this invention. Examples of chemical photoinitiator systems include benzophenone, benzoin ether, benzil ketals and acetophenone and its derivatives. Other suitable initiator systems are described, for example, in U.S. Pat. Nos. 3,469,982, 4,451,523 and 4,358,477, the teachings of which are incorporated herein by reference. The amount of photoinitiator employed may vary over a wide range, depending upon the polymerizable acrylic substances, the particular photoinitiator system and the desired time of development. Generally, the photoinitiator chemical system comprises between about 3 and about 15 wt. percent of the total weight of components (a)–(f).

The material which imparts the excellent hardness and durability to the film or layer after development and final curing is the epoxy resin or mixture of epoxy resins. The epoxy resin or resins comprise between about 20 and about 80 percent by weight (preferably between about 30 and about 60 wt. percent) of the total weight of components (a)–(f). At high temperatures and/or in the presence of a catalyst, the epoxy groups of the resin molecules open and react with other materials present. Primarily the epoxy resin molecules react with the acidic curative (e); however, to a certain extent, the epoxy molecules react during final curing with the cross-linking agent (f), and perhaps also with the photopolymerized acrylic material and any remaining unpolymerized acrylate monomers or moieties. Preferably the epoxy resin or mixture of resins is solid at about room temperature. The photoimageable composition can be applied as a liquid film to the substrate after dissolving the solid epoxy resin in the solvent-based mixture first.

A wide variety of epoxy resins are suitable for use in accordance with the present invention. Typically, epoxies of the Bisphenol A and Novalac type are used. Other suitable epoxy resins are described, for example, in U.S. Pat. No. 4,092,443, the teachings of which are incorporated herein by reference. Cycloaliphatic epoxides, such as those sold under the trade names Cyanacure UVR-6100 and UVR-6110 by Union Carbide, Danbury, Conn. are also useful. Epoxy resins used in accordance with the invention preferably have epoxide equivalents of between 200 and about 700.

The photoimageable composition according to this invention is intended to be hardened to form a permanent photomask. Hardening is primarily attributed to the curing of the epoxy resin. To promote sufficiently rapid curing of the epoxy resin, the photoimageable composition of the present invention employs an acidic curative. Acidic cure catalysts include not only substances which have free carboxyl groups, but also chemicals such as anhydrides, which may produce free carboxyl groups. In fact, for many applications of the present invention, an anhydride, e.g., an anhydride of a multifunctional carboxylic acid is the preferred curative. Other useful catalysts are those having a blocked carboxylic group, which becomes deblocked at a threshold temperature. Epoxy cure catalysts are generally used at levels of from about 0.1 to about 10 wt. percent of the total weight of components (a)–(f).

Although photoimageable compositions in accordance with the present invention do not necessarily require an additional cross-linking agent, a cross-linking agent (f) is highly desirable. A cross-linking agent is particularly useful in connecting the acrylate chemical system and the epoxy chemical system in a single interconnected network in the final solder mask layer. Free hydroxyl groups, e.g., on the epoxy resins and the epoxy-acrylate oligomers, generally provide the basis for such cross-linking. The cross-linking agent (f) is typically used at a level of at least about 2 wt. percent, 3–5 wt. percent being preferred.

In accordance with one aspect of the invention, the cross-linking agent is a melamine-formaldehyde resin. A melamine-formaldehyde resin is particularly useful if the epoxy curative is an anhydride. During initial application of the photoimageable composition as a layer, it is believed that the melamine-formaldehyde resin reacts to some extent with the anhydride. This opens the anhydride, providing carboxyl functionality for subsequent epoxy curing. This initial reaction also has a surface drying effect. Melamine-formaldehyde resin acts to cross-link through free hydroxyl groups. Preferred melamine-formaldehyde resins have methylated melamine moieties.

In accordance with another aspect of the invention, a blocked, multifunctional isocyanate may be used as the cross-linking agent. The blocked isocyanate is selected to deblock generally at the cure temperature of the epoxy resin. An example of a suitable blocked isocyanate is Σ-caprolactam-blocked isophorone. If a blocked isocyanate is the cross-linking agent and an anhydride is the curative, some preheating of the photoimageable composition at a time prior to cure is desirable. Such preheating opens anhydride species, providing the acid functionality needed to promote curing of the epoxy resin.

The components of the photoimageable composition are selected to be soluble in a common solvent to form a single-phase liquid composition. The liquid photoimageable composition may be applied to a substrate by a variety of application methods, including screen printing, curtain coating, roller coating and extrusion coating. Each application method has its own particularities, and photoimageable compositions in accordance with this invention may be formulated in accordance with the particular requirements of the particular method of application.

Components (a)–(f) are selected such that a homogeneous dried composition of these is soluble in alkaline aqueous solution, whereby a layer of the photoimageable composition may be developed in alkaline aqueous solution, e.g., 1% sodium carbonate.

A mixture of components (a)–(f) is typically too viscous to be easily applied as a layer; accordingly, it is generally the practice to dilute the components (a)–(f) with an organic solvent. Typically, solvent is used at a level of 10–60 wt. percent relative to components (a)–(f), but this will vary depending upon the means of application. For screen printing, solvent is generally used at 10–20%; for electrostatic spray coating, at 20–60%; for curtain coating generally at 40–50%; and for application as a dry film typically about 50%. Suitable solvents include, but are not limited to ethylene glycol monoethyl ether, ethylene glycol monopropyl ether, ethylene glycol monobutyl ether, ethylene glycol 2-ethylhexyl ether, ethylene glycol monohexyl ether, diethylene glycol monomethyl ether, diethylene glycol monoethyl ether, diethylene glycol monopropyl ether, diethylene glycol monobutyl ether, dipropylene glycol methyl ether, propylene glycol monobutyl ether, propylene glycol monopropyl ether, propylene glycol methyl ether, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, ethylene glycol diacetate, $CH_3COO(CH_2)_nCOOCH_3$ n=2,3,4, 2-ethylhexyl acetate, n-butyl acetate, isobutyl acetate, n-propyl acetate, ethyl acetate, diacetone alcohol, dimethyl formamide, isophorone, diisobutyl ketone, cyclohexanone, isobutyl isobutyrate, methyl n-amyl ketone, amyl acetate, methyl amyl acetone, methyl isoamyl ketone, 2-nitropropane, methyl isobutyl ketone, methyl n-propyl ketone, isopropyl acetate, methyl ethyl ketone, tetrahydrofuran, acetone, methyl acetate, N-methyl pyrolidone and γ-butyrolactone.

In addition to the components described above which are essential to a photoimageable composition in accordance with the invention, the photoimageable composition may optionally contain additional components which are standard in the art. The photoimageable composition may contain organic or inorganic fillers at levels up to about 35 wt. percent relative to the total weight of components (a)–(f). Some examples of fillers are micro talc, ground polyethylene, clay, fumed silica and polyvinylidene fluoride. Also, relatively small amounts of flow-control agents, antioxidants, dyes, etc. may be added. Fillers may effect the final appearance of the solder mask, e.g. provide a matte finish.

In practice, a photoimageable composition is applied as a layer to a printed circuit board (or to a support sheet in the case of a dry film). After application, the layer is dried to remove organic solvent. During this drying, some reaction of components may occur, particularly between an anhydride and a melamine-formaldehyde resin. After drying, the homogeneous dried photoimageable layer is exposed to patterned actinic radiation and then developed in alkaline aqueous developer in a conventional manner. It is preferred at this time to effect a UV cure to tie up any unreacted acrylate; however, this step is optional. Subsequently, the layer is heat cured, e.g., at 150° C. for at least one hour. Prior to heat cure, i.e., prior to activation of the epoxy chemical system, the layer of photoimageable compositions remains strippable by common strippers, should there be any need to remove the layer, e.g., for reworking.

The ability to be developed with aqueous or alkaline aqueous solutions is considered to be an important advantage of the photoimageable composition of the present invention. Eliminating the need for solvent-based developers eliminates the cost of the solvents as well as health, environmental and recycling problems. Although the films formed in accordance with the invention are developable in aqueous solutions without any organic solvents, developers may include some organic solvents, providing that the added organic solvent does not solubilize the exposed portions of the film.

An additional advantage of the composition of the present invention is that the cured composition of the present invention can withstand electroless plating baths and can therefore be used in an additive plating process. It is believed that the present invention represents the first aqueous-developable solder mask forming composition which can withstand a full build copper electroless plating bath, i.e., a bath having a pH greater than 12 and a temperature above 50° C.

As an example of one additive plating procedure in which the composition of the present invention may be used, the composition is applied as a layer to a non-conducting board to which has been applied catalyst to promote electroless plating. The layer is exposed, developed and fully cured. Next, the board is subjected to a plating bath until a sufficient built-up of metal occurs. This is usually when the metal is about flush with the upper surface of the cured composition layer. The resulting plated surface provides a flush, uniform surface which allows the easy attachment of surface mount components. The additive process is more efficient than the current subactive printed circuit board process. The fact that the resist is aqueous developable and is not stripped after plating is environmentally favorable.

The aqueous-developable composition in accordance with the invention is also useful for forming a permanent inner layer in a multi-layer printed circuit board.

The invention will now be described in greater detail by way of specific examples.

EXAMPLE 1

A composition was prepared as follows:

| Component | % Wt. |
|---|---|
| Tris(2-hydroxyethyl) isocyanurate triacrylate | 18.7 |
| Methylated melamine | 3.4 |
| Hetron 912 (epoxy methacrylate resin) | 6.2 |
| Novacure 3701 (diacrylate ester of a bisphenol A epoxy resin) | 6.2 |
| Epoxy cresol novolac resin, epoxy eq. 235 | 23.8 |
| Bisphenol A epoxy resin, epoxy eq. 575–685 | 23.3 |
| 5-(2,5-dioxotetrahydrofuryl)-3-methyl-3-cyclohexene-1,2-dicarboxylic anhydride | 8.6 |
| 2,2-dimethoxy-2-phenyl acetophenone | 1.4 |
| 2-methyl-1-[4-(methylthio)phenyl]-2-(4-morpholinyl)-1-propanone | 6.2 |
| isopropylthioxanthone | 2.3 |
| | 100.0 |
| PLUS Additives: | |
| Modaflow | 0.9 |
| Byk 361, 306 (equal portions) | 0.8 |
| Pigment (Penn Green) | 1.0 |
| Filler (Cabosil EH5, fumed silica) | 1.5 |
| Inhibitor (MEHQ) | 0.1 |
| Solvent (Amount and type appropriate to the method of application) Solvent used: Ethyl-3-ethoxy propionate (EEP) | |

The photoimageable composition was applied as a wet film via a curtain coating process. The following coating conditions were used: 11.1 gm wet coating material per square foot laminate was applied in order to achieve an approximate dry film thickness of 2.0 to 2.2 mils on laminate and 0.8 to 0.9 mils dry film thickness on the copper circuitry. Coating speed was 80 to 90 meters per minute. The working viscosity of the photoimageable composition during coating was a Zahn Cup No. 5 reading of 22 seconds, 25° C. This was equivalent to approximately 60 wt. percent solids. The photoimageable composition was dried at 90° C. for 15 minutes, and cooled to room temperature. The second side as then coated in a manner identical to the first side. The second side was dried to a tack-free surface at 90° C. for 30 minutes. A diazo artwork was placed directly on the film, and the film was exposed to actinic radiation having a UV energy exposure level of at least 350 m joules/cm$^2$ at the working surface. Exposure time should be such that the exposed portion of the coating remains intact during the aqueous developing process. The film was developed in a basic aqueous solution, i.e., 1% by weight sodium carbonate monohydrate. The film was UV-cured by exposure to actinic radiation having a UV energy exposure level of at least 2 joules/cm$^2$. Heat curing was at 150° C. for 1 hour.

EXAMPLE 2

A composition was prepared as follows:

| Component | % Wt. |
|---|---|
| Tris(2-hydroxyethyl) isocyanurate triacrylate | 18.5 |
| Methylated melamine | 3.4 |
| Hetron 912 | 6.1 |
| Novacure 3701 | 6.1 |
| Epoxy cresol novolac resin, epoxy eq. 235 | 46.7 |
| 5-(2,5-dioxotetrahydrofuryl)-3-methyl-3-cyclohexene-1,2-dicarboxylic anhydride | 8.5 |
| 2,2-dimethoxy-2-phenyl acetophenone | 3.7 |
| 2-methyl-1-[4-(methylthio)phenyl]-2-(4-morpholinyl)-1-propanone | 4.7 |
| isopropylthioxanthone | 2.2 |
| | 99.9 |
| PLUS Additives: | |
| Byk 361, 306 (equal portions) | 0.8 |
| Pigment (Penn Chips) | 1.0 |

-continued

| Component | % Wt. |
|---|---|
| Filler (precipitated silica, Syloid 72) | 1.5 |
| Inhibitor (MEHQ) | 0.1 |
| Solvent (Amount and type appropriate to the method of application) Solvent used: Ethyl-3-ethoxy propionate | |

This composition was processed as per Example 1.

EXAMPLE 3

Each of the compositions of Examples 1 and 2 were processed as follows:

The photoimageable composition was applied as a wet film via an electrostatic spray process. The following coating conditions were used. The photoimageable composition was diluted to a Zahn Cup No. 2 viscosity of 60 seconds using an appropriate solvent. The boards were coated by an electrostatically charged solution conveyorized through the aerosol spray at 5 feet per minute. The photoimageable composition was charged via the application of 70,000 volts. Both sides of the board were coated before drying. Drying took place at 80° C. for 30 minutes. A diazo artwork was placed directly on the tack-free film, and the film was exposed to actinic radiation having a UV energy exposure level of at least 350 m joules/cm$^2$ at the working surface. Exposure time should be such that the exposed portion of the coating remains intact during the aqueous developing process. The film was developed in a basic aqueous solution, i.e., 1% by weight sodium carbonate monohydrate. The film was UV-cured by exposure to actinic radiation having a UV energy exposure level of 2 joules/cm$^2$. Heat curing was at 150° C. for 1 hour.

EXAMPLE 4

Each of the compositions of Examples 1 and 2 were processed as follows:

The photoimageable composition was applied as a wet film to a base sheet so as to form a dry film. a wet film of 6 mil thickness was applied by draw down to a base sheet. The solvent evaporated from the film which was covered with a polyester sheet. The film was applied to the circuit board by hot roll lamination. The diazo artwork was placed on the cover sheet during imaging but before developing the cover sheet was removed. The film was exposed to actinic radiation having a UV energy exposure level of at least 350 m joules/cm$^2$ at the working surface. Exposure time should be such that the exposed portion of the coating remains intact during the aqueous developing process. The film was developed in a basic aqueous solution, i.e., 1% by weight sodium carbonate monohydrate. The film was UV-cured by exposure to actinic radiation having a UV energy exposure level of 2 joules/cm$^2$. Heat curing was at 150° C. for 1 hour.

EXAMPLE 5

A composition was prepared as follows:

| Component | % Wt. |
|---|---|
| Tris(2-hydroxyethyl) isocyanurate triacrylate | 7.8 |
| Pentaerythritol Tetraacrylate | 5.7 |
| Epoxy cresol novolac resin, epoxy eq. 235 | 37.6 |
| Novacure 3701 | 19.9 |
| E-Caprolactam-blocked isophorone (Diisocyanate based adduct) | 9.7 |

-continued

| Component | % Wt. |
|---|---|
| 5-(2,5-dioxotetrahydrofuryl)-3-methyl-3-cyclohexene-1,2-dicarboxylic anhydride | 10.3 |
| 2,2-dimethoxy-2-phenyl acetophenone | 5.0 |
| 2-methyl-1-[4-(methylthio)phenol]-2-(4-morpholinyl)-1-propanone | 2.8 |
| isopropylthioxanthone | 1.1 |
| | 99.9 |
| PLUS Additives: | |
| Bubble Breaker | 1.9 |
| Byk 077 | 2.0 |
| Byk 306 | 1.1 |
| Pigment (Penn Green) | 1.2 |
| Filler (fumed silica, Cabosil EH5) | 3.5 |
| Inhibitor (MEHQ) | 0.05 |
| Solvent (Amount and type appropriate to the method of application) Solvent used: Ethyl-3-ethoxy propionate, carbitol acetate (1:1). | |

This photoimageable composition was applied as a wet film via screen printing on a printed circuit board. The screen mesh was varied from 61 to 120 mesh polyester. The screened photoimageable composition was dried at 80° C. for 30 minutes, providing a non-tacky film. A diazo artwork was placed directly on the film, and the film was exposed to actinic radiation having a UV energy exposure level of 350 m joules/cm$^2$. The film was developed in a basic aqueous solution, i.e., 1% by weight sodium carbonate monohydrate. The film was UV-cured by exposure to actinic radiation having a UV exposure level of 2 joules/cm$^2$. Heat curing was at 150° C. for 1 hour.

EXAMPLES 6-8

The photoimageable composition described in Example 5 was also applied to a printed circuit board as a wet film by curtain coating, as a wet film by electrostatic spray, and as a dry film as described in the above examples.

Examples 9-11

Solder masks made from resist formulations according to Examples 1-3 were used in electroless copper plating baths. The bath contained copper/formaldehyde solution, chelator, caustic and replenishers. The bath was maintained at a temperature of about 68° C., a specific gravity of 1.08 and a pH of about 12. Deposition was at a rate of about 80 to 90 millionths per hour and conducted to deposit a layer of copper in excess of 1 mil. The resists survived 8 hours in the above bath with no attack of the resist surface. No delamination or loss of adhesion over epoxy-glass or copper was observed. Following electroless copper plating, the resist was able to withstand subsequent processing including permanganate desmear.

Several features of the photoimageable composition in accordance with the present invention may now be more fully appreciated. As a liquid, the composition allows the encapsulation of complex circuit board designs. The composition is aqueous developable. The composition is quickly imaged, provides easy developing. The development leaves the composition strippable (should this be desired) until final cure. The composition may be contact imaged with no cover sheet, giving better resolution than many traditional dry film solder mask compositions. The composition demonstrated thermal and chemical resistance coupled with low ionic contamination values and good thermal shock resistance. The composition provides a solder mask with good appearance.

The composition is an aqueous alkaline developable and strippable resist which after cure can be used in metal plating baths at pH > 12 and elevated temperatures (> 50° C.). After plating, the resist remains a permanent part of the printed circuit board and does not diminish the printed circuit board's performance in subsequent processing steps.

While the invention has been described in terms of certain preferred embodiments, modifications obvious to one with ordinary skill in the art may be made without departing from the scope of the present invention.

Various features of the invention are set forth in the following claims.

What is claimed is:

1. A photoimageable composition comprising
    (a) between about 15 and about 35 wt. percent of a polymerizable acrylic monomer,
    (b) between about 3 and about 15 wt. percent of a photosensitive, free radical-generating initiator chemical system which in the presence of actinic radiation initiates polymerization of acrylic moieties,
    (c) between about 5 and about 35 wt. percent epoxyacrylate oligomer,
    (d) between about 20 and about 80 wt. percent of an epoxy resin composition having an epoxy equivalent between 200 and 700, which epoxy composition is curable to harden said photoimageable composition subsequent to exposure to actinic radiation,
    (e) between about 0.1 and about 10 wt. percent of an acidic curative for said epoxy resin, and
    (f) about 2 to about 15 wt. percent of a hydroxyl group-reactive cross-linking agent, said components (a)–(f) being selected so that said components form a homogeneous solution in an organic solvent which dries to a homogeneous composition which is soluble in alkaline aqueous solution, whereby said photoimageable composition is developable in aqueous or alkaline aqueous solution.

2. A photoimageable composition according to claim 1 wherein said curative (e) is an acid or an anhydride.

3. A photoimageable composition according to claim 1 wherein said cross-linking agent (f) is present at a level of between about 2 and about 15 wt. % of said components (a)–(f) and is a melamine-formaldehyde resin.

4. A photoimageable composition according to claim 1 wherein said cross-linking agent (f) is present at a level of between about 2 and about 15 wt. % of said components (a)–(f) and is a blocked multifunctional isocyanate.

5. A photoimageable composition according to claim 1 further comprising a dispersible organic or inorganic filler at a level of up to about 35 wt. percent relative to the total weight of said components (a)–(f).

6. A composition in accordance with claim 1 further comprising an organic solvent at a level of between about 10 and about 60 wt. percent relative to the total weight of said components (a)–(f).

7. A photoimageable composition comprising
    (a) between about 15 and about 35 wt. percent of a polymerizable acrylic monomer,
    (b) between about 3 and about 15 wt. percent of a photosensitive, free radical-generating initiator chemical system which in the presence of actinic radiation initiates polymerization of acrylic moieties,
(c) between about 5 and about 35 wt. percent epoxy-acrylate oligomer,
(d) between about 20 and about 80 wt. percent of an epoxy resin composition having an epoxy equivalent between 200 and 700, which epoxy composition is curable to harden said photoimageable composition subsequent to exposure to actinic radiation,
(e) between about 0.1 and about 10 wt. percent of a curative for said epoxy resin, which curature is an anhydride of a multi-functional carboxylic acid, and
(f) about 2 to about 15 wt. percent of a hydroxyl group-reactive cross-linking agent,
said components (a)-(f) being selected so that said components form a homogeneous solution in an organic solvent which dries to a homogeneous composition which is soluble in alkaline aqueous solution, whereby said photoimageable composition is developable in aqueous or alkaline aqueous solution.

* * * * *